United States Patent
Iwata

(10) Patent No.: US 10,673,428 B2
(45) Date of Patent: Jun. 2, 2020

(54) DRIVER CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventor: Shigeyasu Iwata, Hamura Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 8 days.

(21) Appl. No.: 16/056,824

(22) Filed: Aug. 7, 2018

(65) Prior Publication Data
US 2019/0260369 A1    Aug. 22, 2019

(30) Foreign Application Priority Data
Feb. 16, 2018   (JP) .................. 2018-026041

(51) Int. Cl.
*H03K 17/08* (2006.01)
*H03K 17/082* (2006.01)
*G05F 1/575* (2006.01)

(52) U.S. Cl.
CPC ......... *H03K 17/0822* (2013.01); *G05F 1/575* (2013.01)

(58) Field of Classification Search
CPC ... H03K 17/08; H03K 17/082; H03K 17/0822
See application file for complete search history.

(56) References Cited

U.S. PATENT DOCUMENTS

| 5,375,029 A * | 12/1994 | Fukunaga | G05F 1/573 323/285 |
| 5,422,593 A * | 6/1995 | Fujihira | G05F 1/573 327/427 |
| 8,045,310 B2 * | 10/2011 | Zanardi | H03K 17/0822 361/93.7 |
| 2007/0206338 A1 | 9/2007 | Ishino | |

FOREIGN PATENT DOCUMENTS

| JP | 2007-325371 A | 12/2007 |
| JP | 5287261 B2 | 9/2013 |
| WO | 2006/016456 A1 | 2/2006 |

* cited by examiner

*Primary Examiner* — Hai L Nguyen
(74) *Attorney, Agent, or Firm* — White & Case LLP

(57) ABSTRACT

According to one embodiment, a driver circuit includes an output transistor where a main current path is connected between a voltage supply terminal and a voltage output end and which supplies an output current to the voltage output end, a drive circuit that outputs a drive signal, a variable resistance connected between an output terminal of the drive circuit and a gate of the output transistor, a current detection circuit that detects a current flowing through the output transistor, and a control circuit that changes a value of the variable resistance in response to an output signal of the current detection circuit.

20 Claims, 4 Drawing Sheets

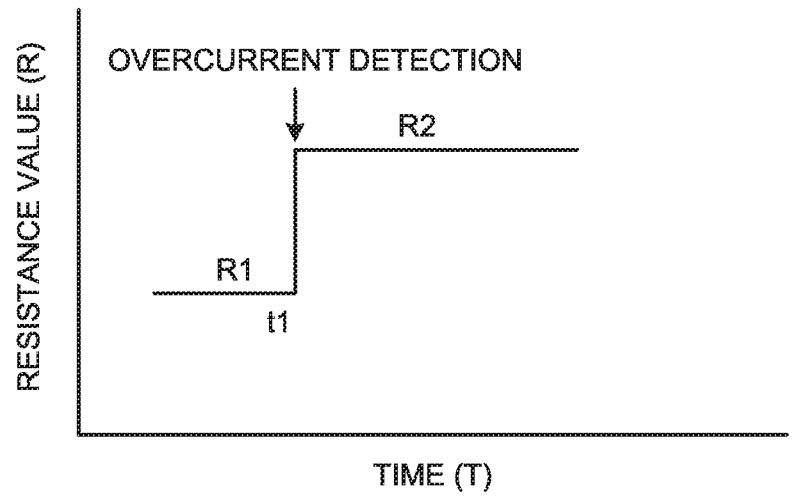
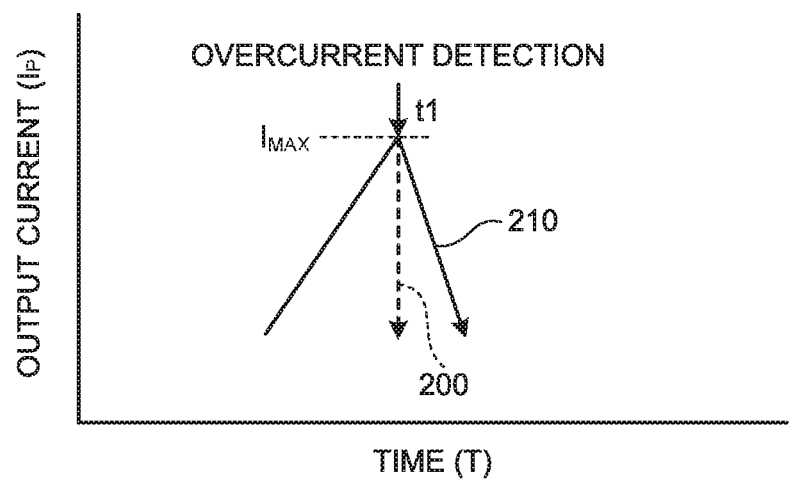

DRIVER CIRCUIT

CROSS-REFERENCE TO RELATED APPLICATIONS

This application is based upon and claims the benefit of priority from Japanese Patent Application No. 2018-26041, filed on Feb. 16, 2018; the entire contents of which are incorporated herein by reference.

FIELD

Embodiments described herein relate generally to a driver circuit.

BACKGROUND

A technique has been disclosed which turns off an output transistor when an overcurrent state is detected and avoids breakdown of the output transistor due to an overcurrent. A driver circuit can be operated at high speed by increasing a response speed of the output transistor. On the other hand, when instantly turning off an output transistor whose response speed is high, an induction voltage generated in a parasitic inductance of a signal wiring increases in response to change of current flowing through the driver circuit, an internal voltage rises, and an overvoltage is applied to the output transistor, so that there is a risk that the output transistor is broken down. Therefore, a driver circuit is desired which can increase a response speed of the output transistor an a steady operation and can suppress generation of overvoltage in a protection operation against an overcurrent.

BRIEF DESCRIPTION OF THE DRAWINGS

FIG. 2 is a diagram for explaining a control method of a resistance value of the first embodiment;

FIG. 3 is diagram for explaining a state of an output current of an output transistor;

DETAILED DESCRIPTION

According to one embodiment, a driver circuit includes a first output transistor where a main current path is connected between a voltage supply terminal and a voltage output end and which supplies an output current to the voltage output end, a first drive circuit that outputs a first drive signal, a first variable resistance connected between an output end of the first drive circuit and a gate of the first output transistor, a first current detection circuit that detects a current flowing through the first output transistor, and a control circuit that changes a value of the first variable resistance in response to an output signal of the first current detection circuit.

Hereinafter, the driver circuit according to embodiments will be described in detail with reference to the drawings. The embodiments do not limit the present invention.

(First Embodiment)

Figure 1:
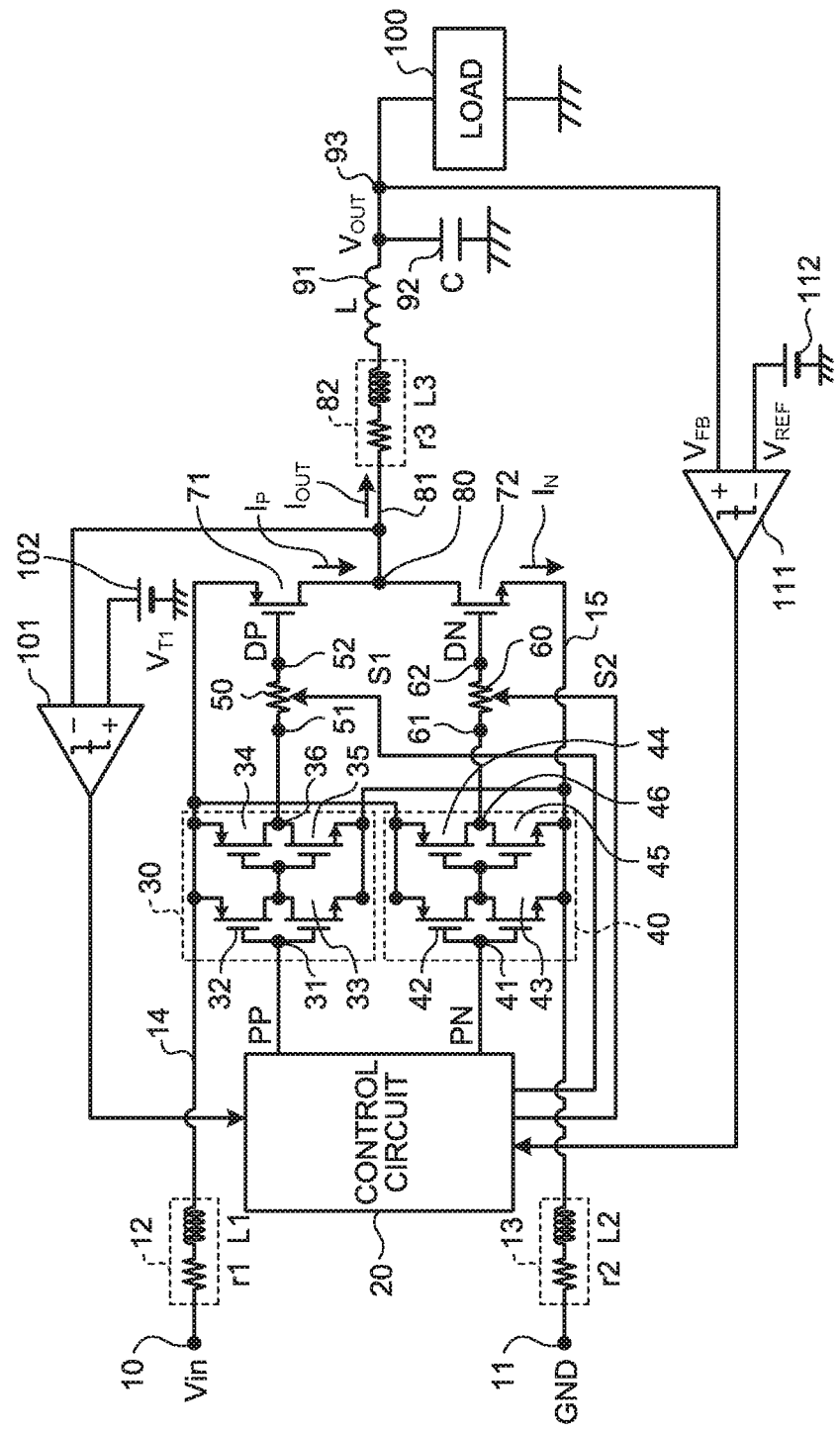
FIG. 1 is a diagram illustrating a driver circuit of a first embodiment.

FIG. 1 a diagram illustrating a driver circuit of a first embodiment. The driver circuit according to the present embodiment represents an embodiment of a DCDC converter.

The present embodiment has a PMOS output transistor 71 where a source-drain path, which is a main current path, is connected to a voltage input terminal 10 and a voltage output end 80. The source of the PMOS output transistor 71 is connected to the voltage input terminal 10 through a signal line 14. An input voltage Vin is supplied to the voltage input terminal 10. The drain of the PMOS output transistor 71 is connected to the voltage output end 80.

A circuit element 12 having resistance r1 and inductance L1 equivalently indicates resistance and parasitic inductance of the signal line 14 and a circuit element 13 having resistance r2 and inductance L2 equivalently indicates resistance and parasitic inductance of a signal line 15. The signal lines 14 and 15 include wiring on a semiconductor integrated circuit device (not illustrated in the drawings) where a driver circuit is formed, a bonding wire (not illustrated in the drawings) connected to the semiconductor integrated circuit device, or the like.

The driver circuit according to the present embodiment has an NMOS output transistor 72 where a source-drain path, which is a main current path, is connected between the voltage output end 80 and a ground terminal 11. The source of the NMOS output transistor 72 is connected to the ground terminal 11 through the signal line 15. A ground potential GND is supplied to the ground terminal 11. The drain of the NMOS output transistor 72 is connected to the voltage output end 80.

The driver circuit according to the present embodiment has a drive circuit 30 that amplifies a drive control signal PP supplied from a control circuit 20 and outputs the amplified drive control signal PP. The drive circuit 30 has an inverter circuit including a PMOS transistor 32 and an NMOS transistor 33 and an inverter circuit including a PMOS transistor 34 and an NMOS transistor 35.

The drive control signal PP from the control circuit 20 is supplied to an input terminal 31 where the gates of the PMOS transistor 32 and the NMOS transistor 33 are connected. An output signal of the drive circuit 30 is outputted from an output terminal 36 where the drain of the PMOS transistor 34 and the drain of the NMOS transistor 35 are connected.

The output terminal 36 of the drive circuit 30 is connected to one end 51 of a variable resistance 50. The other end 52 of the variable resistance 50 is connected to the gate of the PMOS output transistor 71. The drive control signal PP outputted from the control circuit 20 is amplified by the drive circuit 30 and supplied to the gate of the PMOS output transistor 71 through the variable resistance 50 as a drive signal DP.

A resistance value of the variable resistance 50 is controlled by a control signal S1 supplied from the control circuit 20.

The driver circuit according to the present embodiment has a drive circuit 40 that amplifies a drive control signal PN supplied from the control circuit 20 and outputs the amplified drive control signal PN. The drive circuit 40 has an inverter circuit including a PMOS transistor 42 and an NMOS transistor 43 and an inverter circuit including a PMOS transistor 44 and an NMOS transistor 45.

The drive control signal PN from the control circuit 20 is supplied to an input terminal 41 where the gates of the PMOS transistor 42 and the NMOS transistor 43 are connected. An output signal of the drive circuit 40 is outputted from an output terminal 46 where the drain of the PMOS transistor 44 and the drain of the NMOS transistor 45 are connected.

The output terminal 46 of the drive circuit 40 is connected to one end 61 of a variable resistance 60. The other end 62 of the variable resistance 60 is connected to the gate of the NMOS output transistor 72. The drive control signal PN outputted from the control circuit 20 is amplified by the drive circuit 40 and supplied to the gate of the NMOS output transistor 72 through the variable resistance 60 as a drive signal DN.

A resistance value of the variable resistance 60 is controlled by a control signal S2 supplied from the control circuit 20.

The voltage output end 80 is supplied to one end of an inductor 91 through a signal line 81 and the other end of the inductor 91 is connected to an output voltage supply terminal 93. A circuit element 82 having resistance r3 and inductance L3 equivalently indicates resistance and parasitic inductance of the signal line 81.

A smoothing capacitor 92 is connected to the output voltage supply terminal 93. The smoothing capacitor 92 smoothes a voltage supplied through the inductor 91. An output voltage $V_{OUT}$ is supplied from the output voltage supply terminal 93 to a load 100.

The driver circuit according to the present embodiment has a comparison circuit 111 that compares a feedback voltage $V_{FB}$ obtained by feeding back the output voltage $V_{OUT}$ of the output voltage supply terminal 93 with a reference voltage $V_{REF}$ supplied by a power supply 112. In response to an output signal of the comparison circuit 111, the control circuit 20 controls on-duty of the drive control signals PP and PN and performs control so that the output voltage $V_{OUT}$ of the output voltage supply terminal 93 becomes equal to the reference voltage $V_{REF}$.

The driver circuit of the present embodiment has a comparison circuit 101 whose inversion input terminal (−) is connected to the voltage output end 80 and whose non-inversion input terminal (+) is connected to a power supply 102 that supplies a threshold voltage $V_{T1}$.

The comparison circuit 101 supplies an output signal, which becomes positive when a voltage or the voltage output end 80 drops below the threshold voltage $V_{T1}$, to the control circuit 20.

The threshold voltage $V_{T1}$ is set to, for example, a value calculated by the following formula (1).

$$V_{T1} = V\text{in} - R_{ON71} \times I_{MAX} \quad (1)$$

Here, Vin is a value of an input voltage supplied to the voltage input terminal 10, $R_{ON71}$ is a value of on-resistance of the PMOS output transistor 71, and $I_{MAX}$ is a threshold value of an output current $I_P$ of the PMOS output transistor 71 that is set as an overcurrent state. The output current $I_P$ of the PMOS output transistor 71 can be detected by the comparison circuit 101.

When the output current $I_P$ of the PMOS output transistor 71 exceeds $I_{MAX}$, the comparison circuit 101 outputs a positive output signal and detects that an overcurrent state occurs. For example, it is possible to detects an overcurrent state that occurs when the voltage output end 80 is in a state of ground fault. For example, $I_{MAX}$ is set to twice the rated current.

The control circuit 20 receives a positive output signal from the comparison circuit 101 and performs control to increase the resistance value of the variable resistance 50. By this control, a resistance value R connected to the gate of the PMOS output transistor 71 increases, so that a time constant indicated by a multiplication value (C×R) of a capacitance C of the gate of the PMOS output transistor 71 and the resistance value R increases. Thereby, a response speed of the PMOS output transistor 71 decreases. This corresponds to apparently decreasing a driving performance of the PMOS output transistor 71.

When performing control to decrease the response speed of the PMOS output transistor 71 and decrease the driving performance of the PMOS output transistor 71, change of the output current $I_P$ flowing through the PMOS output transistor 71 becomes slow.

In other words, when detecting an overcurrent state, control to suddenly turn off the PMOS output transistor 71 is not performed but control to suppress rapid change of the output current $I_P$ of the PMOS output transistor 71 by decreasing the response speed of the PMOS output transistor 71 is performed.

Inductance generates an induction voltage acting to suppress change of a current. An induction voltage V is represented by V=L1·di/dt. When detecting an overcurrent state, if the PMOS output transistor 71 is instantly turned off and the output current $I_P$ flowing through the PMOS output transistor 71 is rapidly changed, the parasitic inductance L1 equivalently indicated by the circuit element 12 generates the induction voltage V that suppresses the change, that is, a voltage that raises the source voltage of the PMOS output transistor 71.

It is possible to suppress the induction voltage V generated by the parasitic inductance L1 by slowing the change of the output current $I_P$ flowing through the PMOS output transistor 71, so that it is possible to suppress a rise of an internal voltage applied by the signal line 14 to the source of the PMOS output transistor 71. Thereby, it is possible to suppress a rise of a voltage applied between the source of the PMOS output transistor 71 and the source of the NMOS output transistor 72. Thus, it is possible to avoid a state where an overvoltage is applied between the source of the PMOS output transistor 71 and the source or the NMOS output transistor 72 and avoid a risk of being broken down.

When turning off the PMOS output transistor 71, by the action of the inductor 91, an output current $I_{OUT}$ is supplied by an output current $I_N$ flowing through the NMOS output transistor 72. In other words, the output current $I_{OUT}$ flows through the signal line 15. The NMOS output transistor 72 is off immediately after the PMOS output transistor 71 turned off, so that the output current $I_{OUT}$ flows through a parasitic diode (not illustrated in the drawings) of the NMOS output transistor 72.

Similarly, an induction voltage that suppresses change of a current flowing through the signal line 15 is generated in a parasitic inductance L2 of the signal line 15. In other words, an induction voltage whose positive side faces the ground terminal 11 is generated. The induction voltage becomes a voltage that lowers the source voltage of the NMOS output transistor 72. In other words, the induction voltage lowers internal ground potential supplied by the signal line 15.

When an overcurrent is detected, by slowing down an operation to turn off the PMOS output transistor 71, it is possible to suppress rapid change of a current flowing through the signal line 15 and suppress lowering of the internal ground potential supplied by the signal line 15.

Further, by increasing the resistance value of the variable resistance 60 connected to the gate of the NMOS output transistor 72 and decreasing the response speed of the NMOS output transistor 72 in addition to control to increase the resistance value of the variable resistance 50 connected to the gate of the PMOS output transistor 71, control is performed that maintains a balance between the response speed of the PMOS output transistor 71 and the response speed of the NMOS output transistor 72. Thereby, it is possible to stabilize a circuit operation of the driver circuit.

As a result, it is possible to suppress change of the internal voltage and the internal ground potential supplied by the signal line 14 and the signal line 15 during a protection operation after detection of the overcurrent, so that it is possible to avoid a situation where an overvoltage is applied between the source of the PMOS output transistor 71 and the source of the NMOS output transistor 72. Thereby, it is possible to avoid a situation where the PMOS output transistor 71 and/or the NMOS output transistor 72 are broken down by the overvoltage.

In a steady operation, it is possible to increase the response speed of each of the PMOS output transistor 71 and the NMOS output transistor 72 by performing control to reduce the resistance value of the variable resistance 50 connected to the gate of the PMOS output transistor 71 and the resistance value of the variable resistance 60 connected to the gate of the NMOS output transistor 72, so that it is possible to operate the driver circuit at high speed.

The driver circuit of the present embodiment lowers the response speeds of the PMOS output transistor 71 and the NMOS output transistor 72 and suppresses rapid change of output currents by controlling the values of the variable resistances connected to the gates of the PMOS output transistor 71 and the NMOS output transistor 72 when an overcurrent is detected. Therefore, the driver circuit avoids a state where an overvoltage is applied between the sources of the PMOS output transistor 71 and the NMOS output transistor 72 by the signal line 14 and the signal line 15.

A gate current of each of the PMOS output transistor 71 and the NMOS output transistor 72 is very small, so that an increase of power consumption due to provision of the variable resistances 50 and 60 can be ignored. Therefore, it is possible to avoid a risk of breaking down the output transistors 71 and 72 due to rise of an internal voltage that occurs during an overcurrent protection operation without causing an increase of power consumption.

During a steady operation, it is possible to drive the driver circuit at high speed by increasing the response speeds of the PMOS output transistor 71 and the NMOS output transistor 72 by reducing the resistance values of the variable resistances 50 and 60.

According to the driver circuit of the present embodiment, it is possible to achieve both high speed of the driver circuit during a steady operation and suppress of change of the internal voltage during an overcurrent protection operation after detection of an overcurrent state by controlling the resistance values of the variable resistances 50 and 60. Thereby, it is possible to avoid a risk that the output transistors 71 and 72 are broken down due to an overvoltage of an internal voltage during the overcurrent protection operation.

FIG. 2 is a diagram for explaining a control method of a resistance value of the first embodiment. The horizontal axis represents time (T) and the vertical axis represents the resistance value R. When an overcurrent state is detected at timing t1, for example, the resistance value of the variable resistance 50 of the first embodiment is increased from a resistance value R1 to a resistance value R2. Thereby, as described above, the response speed of the PMOS output transistor 71 decreases and the drive performance decreases equivalently, so that it is possible to suppress rapid change of the output current $I_P$ of the PMOS output transistor 71.

Similarly, it is possible to control the resistance value of the variable resistance 60 connected to the gate of the NMOS output transistor 72 at the timing t1 when an overcurrent is detected.

FIG. 3 is diagram for explaining a state of the output current $I_P$ of the PMOS output transistor 71. The horizontal axis represents time T and the vertical axis represents the output current $I_P$ of the PMOS output transistor 71. At the timing t1, when the output current $I_P$ of the PMOS output transistor 71 exceeds a threshold value $I_{MAX}$ and an overcurrent state is detected, control to increase the resistance value of the variable resistance 50 and turn off the PMOS output transistor 71 is performed.

When the PMOS output transistor 71 is instantly turned off, a rapid change occurs as indicated by a dashed line 200. However, the resistance value of the variable resistance 50 connected to the gate of the PMS output transistor 71 is increased and the PMOS output transistor 71 is slowly turned off, so that as indicated by a solid line 210, the output current $I_P$ of the PMOS output transistor 71 is slowly reduced. Thereby, change of the current flowing through the signal line 14 is slowed down, so that it is possible to suppress an induction voltage due to the parasitic inductance L1 of the signal line 14.

Figure 4:
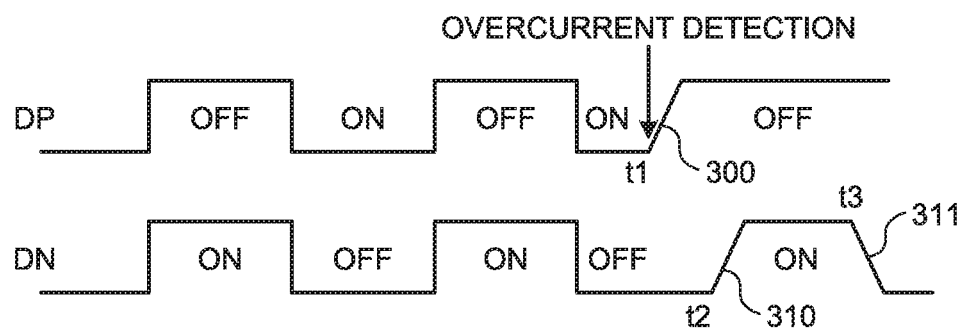
FIG. 4 is diagram for explaining a state of a drive signal applied to a gate of the output transistor.

FIG. 4 is diagram for explaining a state of the drive signal DP applied to the gate of the PMOS output transistor 71 and the drive signal DN applied to the gate of the NMOS output transistor 72. In the DCDC converter, the drive control signals PP and PN are generated considering a predetermined dead time so that the PMOS output transistor 71 and the NMOS output transistor 72 are complementarily turned on/off and the PMOS output transistor 71 and the NMOS output transistor 72 are not turned on at the same time. Therefore, the drive signals DP and DN actually have waveforms that reflect the dead time. However, the drive signals DP and DN are illustrated in a simplified manner.

When the drive signal DP is L level, the PMOS output transistor 71 turns on, and when the drive signal DN is H level, the NMOS output transistor 72 turns on.

When an overcurrent state is detected at the timing t1, the control to increase the resistance value of the variable resistance 50 described above is performed and the control to turn off the PMOS output transistor 71 is performed. In other words, control to set the drive control signal PP to H level is performed.

By increasing the resistance value of the variable resistance 50, the rise of the drive signal DP applied to the gate of the PMOS output transistor 71 becomes gentle as indicated by a solid line 300. Thereby, the response speed of the PMOS output transistor 71 is suppressed.

Similarly, by increasing a CR time constant by increasing the resistance value of the variable resistance 60 connected to the gate of the NMOS output transistor 72, the rise of the drive signal DN from timing t2 when the NMOS output transistor 72 is turned on becomes gentle as indicated by a solid line 310, so that the response speed of the NMOS output transistor 72 decreases.

At timing t3, the drive control signal PN that turns off the NMOS output transistor 72 is outputted from the control circuit 20. However, control to increase the resistance value of the variable resistance 60 is performed, so that the fall of the drive signal DN is slowed down as indicated by a solid line 311. Therefore, the response speed of the NMOS output transistor 72 decreases.

Figure 5:
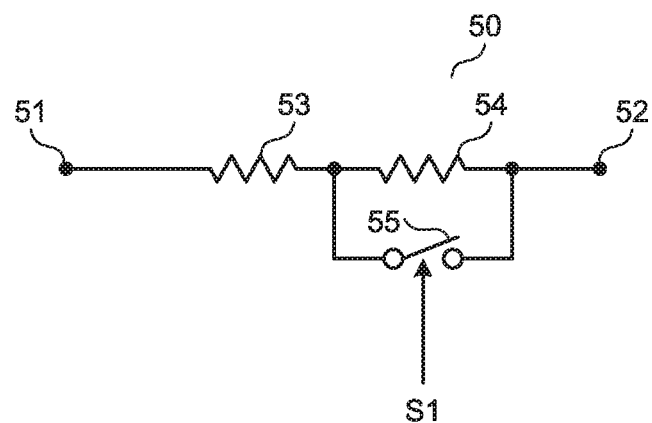
FIG. 5 is a diagram illustrating an embodiment of a variable resistance.

FIG. 5 is a diagram illustrating an embodiment of a variable resistance. FIG. 5 illustrates a configuration example of the variable resistance 50 connected to the gate of the PMOS output transistor 71 according to the first embodiment. The variable resistance 50 includes resistances 53 and 54 connected in series between a terminal 51 and a terminal 52. A switch 55 is connected between both ends of the resistance 54. The switch 55 is controlled by the control signal S1 supplied from the control circuit 20. When an overcurrent state is detected, the control signal S1 is supplied from the control circuit 20, the switch 55 is turned off, and the resistance value of the variable resistance 50 increases. The variable resistance 60 may have the same configuration.

(Second Embodiment)

Figure 6:
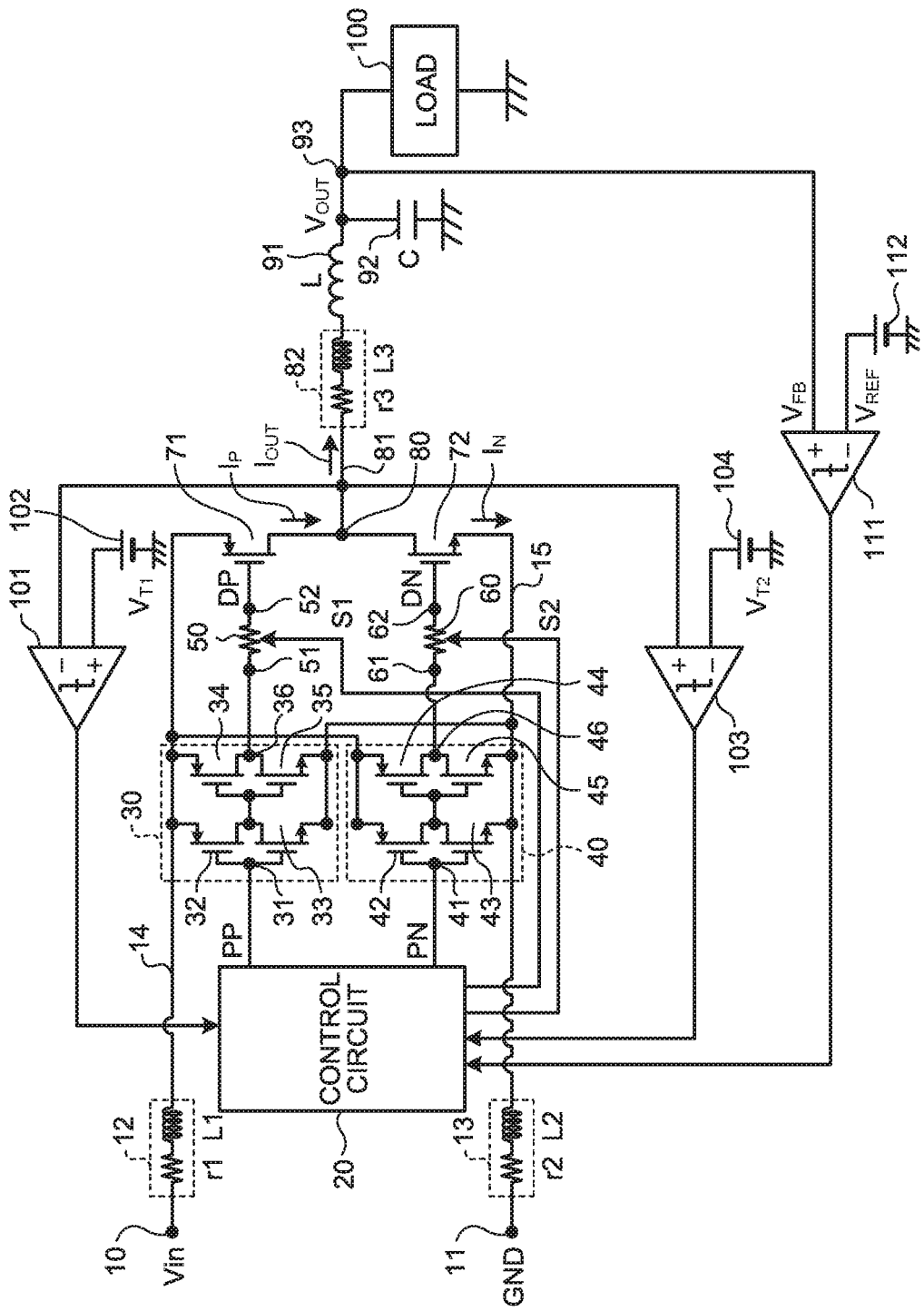
FIG. 6 is a diagram illustrating a driver circuit of a second embodiment.

FIG. 6 is a diagram illustrating a driver circuit of a second embodiment. The same reference numerals are given to the same components as those of the embodiment described above, and redundant description will be omitted.

The driver circuit of the present embodiment has a comparison circuit 103 whose non-inversion input terminal (+) is connected to the voltage output end 80 and whose inversion input terminal (−) is connected to a power supply 104 that supplies a threshold voltage $V_{T2}$.

The comparison circuit 103 supplies an output signal, which becomes positive when a voltage of the voltage output end 80 rises above the threshold voltage $V_{T2}$, to the control circuit 20.

The threshold voltage $V_{T2}$ is set to, for example, a value calculated by the following formula (2).

$$V_{T2} = R_{ON72} \times I_{MAX} \quad (2)$$

Here, $R_{ON72}$ is a value of on-resistance of the NMOS output transistor 72 and $I_{MAX}$ is a threshold value of an output current $I_N$ of the NMOS output transistor 72 that is set as an overcurrent state.

When the output current $I_N$ flowing through the NMOS output transistor 72 exceeds the threshold value the comparison circuit 103 outputs a positive output signal and can detect the overcurrent state. For example, the comparison circuit 103 can detect an overcurrent state that occurs, for example, when the voltage output end 80 is in a state of power-supply fault.

When an overcurrent state is detected, the control circuit 20 performs control to increase the resistance values of the variable resistances 50 and 60 connected to the gates of the PMOS output transistor 71 and the NMOS output transistor 72 and performs control to turn off the NMOS output transistor 72 by the drive control signal PH. As described above, by increasing the resistance values of the variable resistances 50 and 60, it is possible to slow down the response speeds of the PMOS output transistor 71 and the NMOS output transistor 72, suppress rapid change of the currents flowing through the signal lines 14 and 15, and suppress the induction voltages generated in the parasitic inductances L1 and 12 of the signal lines 14 and 15.

It is possible to detect an overcurrent state of both the high-side PMOS output transistor 71 and the low-side NMOS output transistor 72, suppress occurrence of an overvoltage between the signal lines 14 and 15 during a protection operation after detection of an overcurrent state, and avoid a situation where the PMOS output transistor 71 and/or the NMOS output transistor 72 are broken down.

It is possible to apply the driver circuit of the present embodiment not only to a DCDC converter including the high-side PMOS output transistor 71 and the low-side NMOS output transistor 72 but also to a configuration of a driver circuit that supplies the output voltage $V_{OUT}$ and the output current $I_{OUT}$ to the load 100 by the high-side PMOS output transistor 71.

While certain embodiments have been described, these embodiments have been presented by way of example only, and are not intended to limit the scope of the inventions indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A driver circuit comprising:
a first output transistor where a main current path is connected between a voltage supply terminal and a voltage output end and which supplies an output current to the voltage output end;
a first drive circuit that outputs a first drive signal;
a first variable resistance connected between an output terminal of the first drive circuit and a gate of the first output transistor;
a first current detection circuit that detects a current flowing through the first output transistor; and
a control circuit configured to increase a value of the first variable resistance in response to an output signal of the first current detection circuit which indicates that the current flowing through the first output transistor exceeds a predetermined threshold current.

2. The driver circuit according to claim 1, wherein the control circuit supplies a drive control signal that turns off the first output transistor to the first drive circuit in response to the output signal of the first current detection circuit which indicates that the current flowing through the first output transistor exceeds the predetermined threshold current.

3. The driver circuit according to claim 1, further comprising:
a second output transistor where a main current path is connected between the voltage output end and ground;
a second drive circuit that outputs a second drive signal that is supplied complementarily with respect to the first drive signal; and
a second variable resistance connected between an output terminal of the second drive circuit and a gate of the second output transistor,
wherein the control circuit increases a value of the second variable resistance in response to the output signal of the first current detection circuit which indicates that the current flowing through the first output transistor exceeds the predetermined threshold current.

4. The driver circuit according to claim 1, wherein the first current detection circuit includes a first comparison circuit that compares a voltage of the voltage output end with a first reference voltage and supplies the output signal according to a result of the comparison to the control circuit.

5. The driver circuit according to claim 4, wherein the control circuit supplies a drive control signal that turns off the first output transistor to the first drive circuit in response to the output signal of the first current detection circuit which indicates that the current flowing through the first output transistor exceeds the predetermined threshold current.

6. The driver circuit according to claim 4, further comprising:
a second output transistor where a main current path is connected between the voltage output end and ground;

a second drive circuit that outputs a second drive signal that is supplied complementarily with respect to the first drive signal; and a second variable resistance connected between an output terminal of the second drive circuit and a gate of the second output transistor, wherein the control circuit increases a value of the second variable resistance in response to the output signal of the first current detection circuit which indicates that the current flowing through the first output transistor exceeds the predetermined threshold current.

7. The driver circuit according to claim 6, further comprising:

a second current detection circuit that detects a current flowing through the second output transistor, wherein the control circuit changes resistance values of the first variable resistance and the second variable resistance in response to an output signal of the second current detection circuit.

8. The driver circuit according to claim 7, wherein the second current detection circuit includes a second comparison circuit that compares the voltage of the voltage output end with a second reference voltage and supplies the output signal according to a result of the comparison to the control circuit.

9. The driver circuit according to claim 8, wherein the control circuit supplies a drive control signal that turns off the second output transistor to the second drive circuit in response to the output signal of the second current detection circuit which indicates that the current flowing through the second output transistor exceeds a predetermined threshold current.

10. The driver circuit according to claim 8, wherein the control circuit performs control to increase the value of the second variable resistance in response to the output signal of the second current detection circuit which indicates that the current flowing through the second output transistor exceeds a predetermined threshold current.

11. The driver circuit according to claim 10, wherein the control circuit supplies a drive control signal that turns off the second output transistor to the second drive circuit in response to the output signal of the second current detection circuit which indicates that the current flowing through the second output transistor exceeds the predetermined threshold current.

12. A driver circuit comprising:

a first output transistor where a main current path is connected between a voltage supply terminal and a voltage output end and which supplies an output current to the voltage output end;

a second output transistor where a main current path is connected between the voltage output end and ground;

a first drive circuit that outputs a first drive signal;

a second drive circuit that outputs a second drive signal that is supplied complementarily with respect to the first drive signal;

a first variable resistance connected between an output terminal of the first drive circuit and a gate of the first output transistor;

a second variable resistance connected between an output terminal of the second drive circuit and a gate of the second output transistor, a first current detection circuit that detects a current flowing through the first output transistor; and a control circuit that changes values of the first variable resistance and the second variable resistance in response to an output signal of the first current detection circuit.

13. The driver circuit according to claim 12, wherein the control circuit performs control to increase the values of the first variable resistance and the second variable resistance in response to the output signal of the first current detection circuit which indicates that the current flowing through the first output transistor exceeds a predetermined threshold current.

14. The driver circuit according to claim 12, wherein the first current detection circuit includes a first comparison circuit that compares a voltage of the voltage output end with a first reference voltage and supplies the output signal according to a result of the comparison to the control circuit.

15. The driver circuit according to claim 14, wherein the control circuit performs control to increase the values of the first variable resistance and the second variable resistance in response to the output signal of the first current detection circuit which indicates that the current flowing through the first output transistor exceeds a predetermined threshold current.

16. The driver circuit according to claim 12, wherein the control circuit supplies a drive control signal that turns off the first output transistor to the first drive circuit in response to the output signal of the first current detection circuit which indicates that the current flowing through the first output transistor exceeds a predetermined threshold current.

17. The driver circuit according to claim 12, further comprising:

a second current detection circuit that detects a current flowing through the second output transistor, wherein the control circuit changes resistance values of the first variable resistance and the second variable resistance in response to an output signal of the second current detection circuit.

18. The driver circuit according to claim 17, wherein the control circuit supplies a drive control signal that turns off the second output transistor to the second drive circuit in response to the output signal of the second current detection circuit which indicates that the current flowing through the second output transistor exceeds a predetermined threshold current.

19. The driver circuit according to claim 17, wherein the control circuit performs control to increase the values of the first variable resistance and the second variable resistance in response to the output signal of the second current detection circuit which indicates that the current flowing through the second output transistor exceeds a predetermined threshold current.

20. The driver circuit according to claim 19, wherein the control circuit supplies a drive control signal that turns off the second output transistor to the second drive circuit in response to the output signal of the second current detection circuit which indicates that the current flowing through the second output transistor exceeds a predetermined threshold current.

* * * * *